United States Patent [19]
Tanaka et al.

[11] Patent Number: 6,124,711
[45] Date of Patent: *Sep. 26, 2000

[54] MAGNETIC SENSOR USING TUNNEL RESISTANCE TO DETECT AN EXTERNAL MAGNETIC FIELD

[75] Inventors: Atsushi Tanaka; Masashige Sato, both of Kawasaki, Japan

[73] Assignee: Fujitsu Limited, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/785,223

[22] Filed: Jan. 17, 1997

[30]     Foreign Application Priority Data

| Jan. 19, 1996 | [JP] | Japan | 8-007703 |
| Mar. 19, 1996 | [JP] | Japan | 8-062201 |
| Apr. 8, 1996 | [JP] | Japan | 8-085378 |

[51] Int. Cl.$^7$ ............................. H01L 43/08; G01R 33/09
[52] U.S. Cl. ..................... 324/252; 338/32 R; 257/421; 428/611
[58] Field of Search ............................... 324/252, 307.21; 338/32 R; 257/414, 421, 422; 428/611, 615, 617, 622, 623

[56]                 References Cited

U.S. PATENT DOCUMENTS

| 5,287,238 | 2/1994 | Baumgart et al. | 360/113 |
| 5,390,061 | 2/1995 | Nakatani et al. | 360/113 |
| 5,416,353 | 5/1995 | Kamiguchi et al. | |
| 5,462,795 | 10/1995 | Shinjo et al. | |
| 5,658,658 | 8/1997 | Yamamoto | 428/232 |

FOREIGN PATENT DOCUMENTS

| 0 724 302 A1 | 7/1996 | European Pat. Off. |
| 24 42 565 | 4/1975 | Germany . |
| 0 483 373 A1 | 5/1992 | Germany . |
| 0 548 841 A1 | 6/1993 | Germany . |
| 0 578 196 A1 | 1/1994 | Germany . |
| 42 43 357 A1 | 6/1994 | Germany . |
| 42 43 358 A1 | 6/1994 | Germany . |
| 44 27 495 A1 | 2/1996 | Germany . |
| 195 28 245 A1 | 3/1996 | Germany . |
| 3-266481 | 11/1991 | Japan . |
| 5-063254 | 3/1993 | Japan . |
| 5-175571 | 7/1993 | Japan . |
| 6-223336 | 8/1994 | Japan . |
| 6-244477 | 9/1994 | Japan . |
| 07045884 | 2/1995 | Japan . |
| 07074022 | 3/1995 | Japan . |
| 07235709 | 9/1995 | Japan . |
| 07263773 | 10/1995 | Japan . |
| 08078756 | 3/1996 | Japan . |
| 08088424 | 4/1996 | Japan . |
| WO 95/10123 | 4/1995 | WIPO . |
| WO96/24955 | 8/1996 | WIPO . |

OTHER PUBLICATIONS

"Magnetoresistance Effects in Spin–Valve Multilayers Including Three Ni–Fe–Co Layers", Shin Noguchi et al. (Central Research Laboratory, Hitachi, Ltd. Tokyo, Japan); Jpn J. Appl. Phys. vol. 33 (Oct. 1994) Pt. 1, No. 10, pp. 5734–5738.

Suezawa, Y., "Magnetic Tunneling Effect", *IEEE Translation Journal on Magnetics in Japan,* No. 5, pp. 361–367, New York, USA, May 8, 1993.

*Primary Examiner*—Walter E. Snow
*Attorney, Agent, or Firm*—Armstrong, Westerman, Hattori, McLeland & Naughton

[57]              ABSTRACT

A magnetic sensor including a first magnetic layer having an axis of easy magnetization in a first direction; a second magnetic layer having an axis of easy magnetization in a second direction different from the first direction; a third magnetic layer positioned between the first magnetic layer and the second magnetic layer, and having a smaller coercive force than the first magnetic layer and the second magnetic layer; a first insulating layer interposed between the first magnetic layer and the third magnetic layer; and a second insulating layer interposed between the second magnetic layer and the third magnetic layer. An external magnetic field is detected by the use of tunnel resistance between the first magnetic layer and the third magnetic layer and tunnel resistance between the second magnetic layer and the third magnetic layer.

6 Claims, 17 Drawing Sheets

EXTERNAL MAGNETIC FIELD

FIG.6
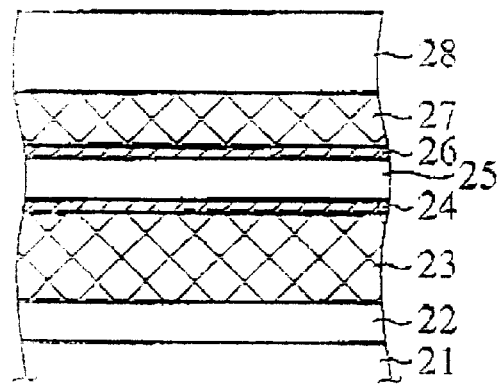
FIG.7A  FIG.7B
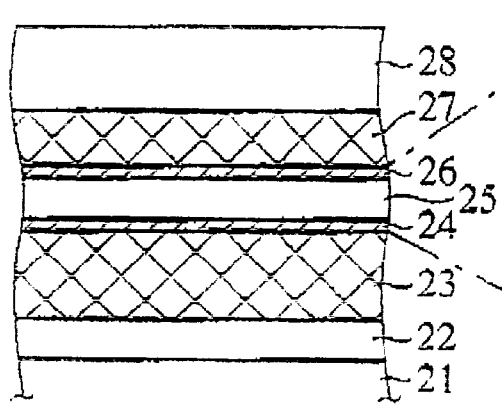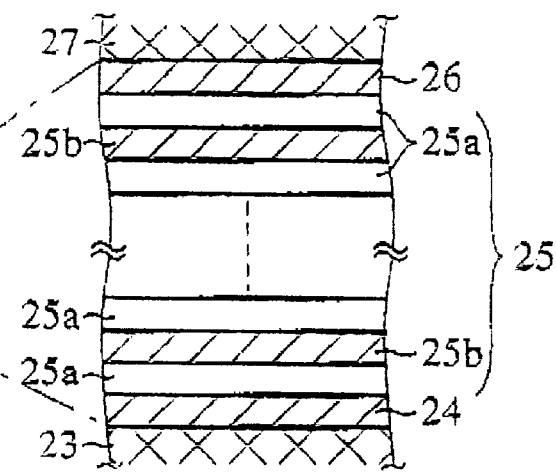

FIG.13

| Hsig ↑ | Hsig ↑ M1 M3 37 35   M²₅/M5/34 | M3 AND M²₅ ARE SUBSTANTIALLY THE SAME DIRECTIONS → r₂ SMALL |
|---|---|---|
| | Hsig ↓ ↓ M2 M4 38 35'   M³₅/M5/34' | M4 AND M³₅ ARE SUBSTANTIALLY OPPOSITE DIRECTIONS → r₃ LARGE |
| Hsig ↓ | ↑ ↑ M1 M3 Hsig 37 35   M5/34/M²₅ | M3 AND M²₅ ARE SUBSTANTIALLY OPPOSITE DIRECTIONS → r₂ LARGE |
| | ↓ ↓ M2 M4 Hsig 38 35'   M5/34'/M³₅ | M4 AND M³₅ ARE SUBSTANTIALLY THE SAME DIRECTIONS → r₃ SMALL |

M²₅ IS SYNTHETIC MAGNETIZATION DIRECTION OF Hsig AND M5 OF SPIN VALVE STRUCTURE 32.
M³₅ IS SYNTHETIC MAGNETIZATION DIRECTION OF Hsig AND M5 OF SPIN VALVE STRUCTURE 33.

FIG.16

| | | |
|---|---|---|
| Hsig ↑ | ↑ ↑ Hsig ⬈M₅² / M5 <br> M1 M3  34 <br> 37 35 | M3 AND M₅² ARE SUBSTANTIALLY THE SAME DIRECTIONS → r₂ SMALL |
| | ↑ ↑ ↓ Hsig⬈M₅³ / M5 <br> M2 M6 M4  34' <br> 38 41 35' | M4 AND M₅³ ARE SUBSTANTIALLY OPPOSITE DIRECTIONS → r₃ LARGE |
| Hsig ↓ | ↑ ↑ M5/34 ⬊M₅² <br> M1 M3 Hsig <br> 37 35 | M3 AND M₅² ARE SUBSTANTIALLY OPPOSITE DIRECTIONS → r₂ LARGE |
| | ↑ ↑ ↓ M5/34' ⬊M₅³ <br> M2 M6 M4 Hsig <br> 38 41 35' | M4 AND M₅³ ARE SUBSTANTIALLY THE SAME DIRECTIONS → r₃ SMALL |

FIG.19

| | | |
|---|---|---|
| ↑ Hsig | ↑ ↑ Hsig M²₅<br>M1 M3  M5<br>61 35  34 | M3 AND M²₅ ARE SUBSTANTIALLY THE SAME DIRECTIONS → r₂ SMALL |
| | ↑ ↑ ↓ Hsig M³₅<br>M1 M6 M4  M5<br>61 41 35'  34' | M4 AND M³₅ ARE SUBSTANTIALLY OPPOSITE DIRECTIONS → r₃ LARGE |
| Hsig ↓ | ↑ ↑ M5<br>        34<br>M1 M3 Hsig M²₅<br>61 35 | M3 AND M²₅ ARE SUBSTANTIALLY OPPOSITE DIRECTIONS → r₃ SMALL |
| | ↑ ↑ ↓ M5<br>        34'<br>M1 M6 M4 Hsig M³₅<br>61 41 35' | M4 AND M³₅ ARE SUBSTANTIALLY THE SAME DIRECTIONS → r₂ LARGE |

MAGNETIC SENSOR USING TUNNEL RESISTANCE TO DETECT AN EXTERNAL MAGNETIC FIELD

BACKGROUND OF THE INVENTION

The present invention relates to a magnetic sensor for detecting a magnetic field and, more specifically, to a magnetic sensor using spin tunnel phenomena or spin valve effect.

1. Field of the Invention

With the recent increased density of the magnetic recording technique, relative speed between a magnetic medium and a reading head has been much lowered.

2. Description of the Related Art

Accordingly, the conventional electromagnetic induction type magnetic head has found it difficult to have sufficient reading output.

As a magnetic sensor which can have high reading output even with the lowered relative speed, a magnetoresistance (MR) magnetic sensor, a spin tunnel magnetic sensor using spin tunnel phenomenon, etc. are proposed.

The spin tunnel magnetic sensor comprises a multi-layer body of a magnetic layer/an insulation layer/a magnetic layer in which an insulation layer is sandwiched by two magnetic layers, and uses the phenomena that when a voltage is applied between the magnetic layers to tunnel electrons, a tunneling probability of electrons changes based on a relative angle between magnetization directions of both magnetic layers. A tunnelling probability of electrons changes based on a relative angle between magnetization directions between both magnetic layers because electron spin of one of the magnetic layers which supplies electrons is polarized, and the electrons tunnel, polarized.

In the conventional spin tunnel magnetic sensor, it is generally known that an insulation film is sandwiched between a first magnetic thin film and a second magnetic thin film and adhered to each other.

Japanese Patent Laid-Open Publication No. 24477/1994 proposes a magnetic sensor comprising a first ferromagnetic thin film and a second ferromagnetic thin film patterned in strips to make axes of easy magnetization rectangular to each other, whereby a coercive force of the first ferromagnetic thin film in a direction of the axis of easy magnetization thereof is more than twice that of the second ferromagnetic thin film in a direction of the axis of easy magnetization thereof. When the magnetization direction of the second ferromagnetic thin film having a smaller coercive force is turned by an external magnetic field, a tunneling current from the first ferromagnetic thin film to the second ferromagnetic thin film changes.

As a material of the ferromagnetic thin film, an Fe-based alloy, which has low anisotropic magnetoresistive effect and high ferromagnetic tunnel effect is proposed (Nakatani and Kitada, Abstract of Autumn Symposium of Japan Metal Association, p. 364, 1994).

Furthermore, to make a coercive force difference between the ferromagnetic thin films, carbon (C) or ruthenium (Ru) is added to the Fe-based alloy, or the thin films are formed at different substrate temperatures.

A magnetic sensor using a multi-layer thin film is known as a different spin tunnel magnetic sensor.

Japanese Patent Laid-Open Publication No. 266481/1991 proposes a magnetoresistive effect device comprising a multi-layer structure of Fe layers with an intermediate layer of a paramagnetic non-insulating material. The device exhibits resistance changes with respect to a low-level applied magnetic field by making magnetization directions horizontally anti-parallel with each other and making the Fe layers in four or more layers.

Japanese Patent Laid-Open publication No. 74022/1995 discloses a magnetic head using a magnetoresistive effect film of a multi-layer structure including a hard magnetic layer, a soft magnetic layer which contacts an antiferromagnetic layer, a soft magnetic layer which is not in contact with an antiferromagnetic layer which are laid one on another, respectively, through non-magnetic layers. The magnetic sensor exhibits high magnetoresistive effect because of the multi-layer body including the two magnetic layers.

Japanese Patent Laid-Open Publication No. 223336/1994 proposes a magnetoresistance read sensor comprising first, second and third ferromagnetic layers which are separated from each other by non-magnetic metal layers. Magnetization directions of the first and the third ferromagnetic layers are stationary, and the second intermediate ferromagnetic layer is soft magnetic material and has a multi-layer double spin valve structure in which, when no magnetic field is applied, a magnetization direction thereof is rectangular to the magnetization directions of the first and the third ferromagnetic layers. This structure permits conduction electrons scattering in any direction to be used, so that the sensor exhibits high magnetoresistive effect even when a low-level magnetic field is applied.

A magnetoresistive effect device of a magnetic sensor using a magnetoresistive effect comprises a spin valve film having a structure of a non-magnetic layer sandwiched by first and a second magnetic layers, or a superlattice gigantic magnetoresistance (GMR) film having a structure of alternate layers of non-magnetic and magnetic material.

Conventional magnetoresistive effect devices will be explained with reference to examples thereof, respectively, including a spin valve film and a superlattice (GMR) film as the MR films.

FIG. 20 is a sectional view of the spin valve film of the conventional magnetoresistive effect device according to one of the examples, and shows the spin valve film of the magnetoresistive effect device used in a magnetic head.

As shown in FIG. 20, the conventional spin valve film has a structure of a first magnetic layer 23, a non-magnetic layer 25, a second magnetic layer 27 laid one on another on a substrate 21 with a ground layer 22 deposited on, and an antiferromagnetic layer 28 of, e.g., FeMn for pinning a magnetization direction of the second magnetic layer.

FIG. 21 is a sectional view of the superlattice GMR film of the conventional magnetoresistive effect device according to the other of the examples, and shows the superlattice GMR film of the magnetoresistive effect device used in a magnetic head.

As shown in FIG. 21, the conventional superlattice GMR film has a structure of a multi-layer film of alternately laid magnetic layers 23 and non-magnetic layers 25 on a substrate 21 with a ground layer 22 of Cu, and a cap layer 29 of Cu covering the top surface of the uppermost magnetic layer 23.

A magnetic sensor using GMR effect is disclosed in, e.g., Japanese Patent Laid-Open Publication No. 358310/1992. this magnetic sensor comprises two ferromagnetic layers which are divided by a non-magnetic metal layer and are not bonded with each other, and has a sandwich structure having magnetization of one of the ferromagnetic layers pinned. The pinning of the magnetization is enabled by adhering an antiferromagnetic metal layer of typically an iron-maganese alloy to one of the ferromagnetic layers. In this structure, when an external magnetic field is applied, a magnetization direction of the ferromagnetic layer whose magnetization is not pinned freely turns in agreement with a direction of the external magnetic field, whereby an angle difference takes place with respect to magnetization direction of the ferromagnetic layer having the magnetization pinned. Depending on this angle difference, scattering of conduction electrons depending on spin changes, and electroresistance value changes take place. By detecting such electroresistance value changes, states of an external magnetic field, i.e., signal magnetic fields from a magnetic recording medium are obtained.

The resistance change of the spin valve magnetic sensor is about 5%. For the prevention of reading errors due to increased magnetic recording density, magnetic sensors having higher magnetic resistance changes are needed.

Furthermore, a magnetic bead and a recording medium are often brought into direct or indirect contact with each other due to projections of the magnetic recording medium, dust or others. At points of the contact abrupt temperature rises occur due to frictional heat. It is known that due to such temperature changes, a resistance of the MR device changes, and output changes take place. Such output changes are called thermal asperities or thermal noises. Conventional art for removing such asperities is described in Japanese Patent Laid-Open Publication No. 154310/1990. This art comprises two MR devices, and the two MR devices are differential for differential detection, whereby thermal asperities are canceled.

As described above, various magnetic sensors using spin tunnel phenomena have been proposed. However, their voltage changes due to spin tunnel phenomena are trivial, and, in addition, signals from recording media are increasingly feeble. Then, it is necessary increase outputs of the magnetic sensors, and to decrease noises.

In the magnetic sensor comprising the spin valve film shown in FIG. 20, the non-magnetic layer 25 is formed of, in most cases, a Cu layer, which produces high magnetoresistive effect. However, a magnetic material of the magnetic layers 23, 27 is an alloy containing an element which tends to be solid-soluble with Cu, e.g., Fe, Co or Mn. Accordingly, thermal diffusion tends to occur in the interfaces between the magnetic layers 23, 27, and the non-magnetic layer 25, and the thermal diffusion tends to be caused by a heat treatment of a magnetic head fabrication process following deposition of the spin valve film, e.g, by baking a resist used as an insulating layer, which often reduces magnetoresistive effect.

Also in the magnetic sensor comprising the superlattice GMR film shown in FIG. 21, the magnetic layer 23 and the non-magnetic layer 25 are formed of, in most cases, magnetic layer containing an element which tends to react with Cu and a non-magnetic layer of Cu, and, accordingly, tend to cause thermal diffusion in a heat treatment process as in the spin valve film, which often leads to lower magnetoresistive effect.

To improvise heat resistance of such spin valve film and superlattice GMR film, it is proposed that the non-magnetic layer is formed of Bag in place of Cu. However, the non-magnetic layer of Ag is aggregated by a heat treatment when the Ag layer is thin, and the spin valve film and the superlattice GMR film are sometimes broken. When the Ag layer is made thicker for the prevention of the aggregation, the magnetoresistive effect is decreased. Thus, it is difficult that the magnetoresistive effect device comprising the non-magnetic layer formed of Ag has high magnetoresistive effect.

Furthermore, Cu tends to corrosive so that it is difficult to provide a magnetic sensor comprising the non-magnetic layer formed of Cu having good corrosion resistance in use environments.

As described above, in the conventional magnetoresistive effect device comprising the non-magnetic layer formed of Cu, a diffusion reaction takes place between the non-magnetic layer and the magnetic layer contacting the non-magnetic layer, which often reduces the magnetoresistive effect. Disadvantageously is reduces the magnetoresistive effect to form the non-magnetic layer of Ag for the prevention of the thermal diffusion. The magnetoresistive effect device comprising the non-magnetic layer formed of Cu has insufficient corrosion resistance.

By making the spin valve magnetic sensor differential, output improves about two-fold, and cancellation of thermal asperities can be expected, but the method described in the prior art needs a track width for two MR devices, which does not meet narrow tracks for higher recording densities.

SUMMARY OF THE INVENTION

A first object of the present invention is to provide a magnetic sensor which overcomes the above-described disadvantages of the magnetic sensors using spin tunnel phenomena, and which has improvised signal-to-noise ratio, and high magnetic field sensitivity.

A second object of the present invention is to provide a magnetic sensor which suppresses diffusion reaction of Cu in the non-magnetic layer, and has good thermal resistance, high magnetoresistive effect, and good corrosion resistance in use environments.

A third object of the present invention is to provide a magnetic sensor which has high reproduction output and can remove thermal asperities.

The above-described first object is achieved by a magnetic sensor comprising: a first magnetic layer having an axis of easy magnetization in a first direction; a second magnetic layer having an axis of easy magnetization in a second direction different from the first direction; a third magnetic layer positioned between the first magnetic layer and the second magnetic layer, and having a smaller coercive force than the first magnetic layer and the second magnetic layer; a first non-magnetic layer interposed between the first magnetic layer and the third magnetic layer; and a second non-magnetic layer interposed between the second magnetic layer and the third magnetic layer, whereby an external magnetic field is detected by the use of tunnel resistance between the first magnetic layer and the third magnetic layer and tunnel resistance between the second magnetic layer and the third magnetic layer.

In the above-described magnetic sensor, it is preferable that the first non-magnetic layer is an insulating layer; and the second non-magnetic layer is an insulating layer.

In the above-described magnetic sensor, it is preferable that the first direction and the second direction are substantially opposite to each other.

In the above-described magnetic sensor, it is preferable that an axis of easy magnetization of the third magnetic layer is substantially normal to the first direction and the second direction.

In the above-described magnetic sensor, it is preferable that an antiferromagnetic layer for pinning the axis of easy magnetization is included in at least one of the first magnetic layer and the second magnetic layer.

In the above-described magnetic sensor, it is preferable that a coercive force of the first magnetic layer and the second magnetic layer is greater than a saturation magnetic field in an axis of difficult magnetization of the third magnetic layer.

In the above-described magnetic sensor, it is preferable that a static magnetic field due to the first magnetic layer and a static magnetic field due to the second magnetic layer compensates each other in the third magnetic layer.

In the above-described magnetic sensor, it is preferable that the magnetic sensor further comprises difference detecting means for detecting a difference between a first electric signal based on a tunnel resistance between the first magnetic layer and the third magnetic layer, and an electric signal based on a tunnel resistance between the second magnetic layer and the third magnetic layer.

The above-described second object is achieved by a magnetic sensor comprising a spin valve structure including a multi-layer body of a first magnetic layer, a non-magnetic layer and a second magnetic layer laid one on another in the stated order, the non-magnetic layer being formed of Cu; and diffusion preventive layers of Ag being provided respectively between the non-magnetic layer and the first magnetic layer, and between the non-magnetic layer and the second magnetic layer.

In the magnetic sensor having the above-described structure, because Ag is not solid-soluble with, e.g., Fe, Co or Mn, the diffusion preventive layer formed of Ag can effectively suppress thermal diffusion between the non-magnetic layer of Cu and the magnetic layer. Because the Ag diffusion preventive layer is provided in close contact with the Cu non-magnetic layer, coagulation in a heat treatment can be suppressed. As a result, the diffusion preventive layer, even when it is thin, does not deteriorate its magnetoresistive effect characteristics.

Thus, the Ag diffusion preventive layer, even when it is thin, exhibits high diffusion prevention effect, and is degraded very little due to coagulation. The magnetic sensor including this diffusion preventive layer has good heat resistance.

Furthermore, sufficient heat resistance of the diffusion preventive layer allows the diffusion preventive layer to be thin and the Cu non-magnetic layer to be thick. This magnetic sensor has high magnetoresistive effect which is substantially equal to that of the magnetic sensor including the non-magnetic layer formed of Cu and in addition, has heat resistance.

The above-described second object is achieved by a magnetic sensor comprising a multi-layer film of alternately laid magnetic layers and non-magnetic layers, the non-magnetic layers being formed of Cu; and a diffusion preventive layer of Ag being provided between the non-magnetic layer and the magnetic layer.

In the magnetic sensor having the above-described structure, the multi-layer structure of the non-magnetic layers and the magnetic layers alternately laid one on another, e.g., the superlattice CMR, includes the non-magnetic layer formed of Cu, and the diffusion preventive layers of Ag provided between the non-magnetic layer and the magnetic layer.

Such structure is considered to a multi-layer structure of the multi-layer structure of the spin valve film including the magnetic layers, the diffusion preventive layer and the non-magnetic layers. Accordingly, as in the above-described magnetic sensor, the thin Ag diffusion preventive layer suppresses diffusion between the magnetic layer and the non-magnetic layer, and in addition, coagulation of the diffusion preventive layer does not take place. The magnetic sensor having this structure can have good heat resistance and high magnetoresistive effect.

In the above-described magnetic sensor, it is preferable that the non-magnetic layer of Cu is replaced by a multilayer film of alternately laid Cu films and Ag films.

In the magnetic sensor having this structure, the non-magnetic layer has little thickness-wise diffusion of Cu, therein owing to the Ag thin film which suppresses diffusion of Cu. Accordingly, in a case that the diffusion preventive layer has insufficient diffusion prevention effect, the diffusion between the non-magnetic layer and the magnetic layer can be sufficiently suppressed. Thus, the magnetic sensor can have good heat resistance.

In the above-described magnetic sensor, it is preferable that the magnetic sensor further comprises a non-magnetic corrosion resistance metal film provided between the Cu film and the Ag film, or the diffusion preventive film and the Cu film or the Ag film.

In the magnetic sensor having this structure, substances which corrodes Cu are prohibited from osmosing the non-magnetic layer by the corrosion resistant metal thin film. Accordingly, the magnetic sensor has device characteristics which are degraded very little by corrosion in operational environments.

It is possible that this corrosion resistant metal thin film is a film of a non-magnetic, corrosion resistant metal, e.g., Au, Pt, or Ti. The corrosion resistant metal film is not essentially monolayer, and it is possible that one or more layers of the corrosion resistant metal films are provided as long as it or they are between the Cu thin film and the Ag thin film, the non-magnetic layer and the diffusion preventive layer.

The magnetic sensor having this structure can have good heat resistance and, accordingly, can have stable magnetic detection sensitivity even when the magnetic sensor is subjected to heat of high temperatures in its fabrication or storage environments.

The above-described third object is achieved by a magnetic sensor comprising a first spin valve structure including a first and a second ferromagnetic layer isolated from each other by a non-magnetic spacer layer, a magnetization direction of the first ferromagnetic layer and a magnetization direction of the second magnetic layer, which is pinned by a first antiferromagnetic layer adjacent to the second ferromagnetic layer being normal to each other when no magnetic filed is applied; and means for detecting an electric resistance caused by a difference in turns of the magnetization directions of the first and the second ferromagnetic layers in the presence of an external magnetic field; a second spin valve structure including a third ferromagnetic layer and a fourth ferromagnetic layer isolated by a non-magnetic spacer layer, the third ferromagnetic layer having a magnetization direction component in the same direction of the magnetization direction of the first ferromagnetic layer, the fourth ferromagnetic layer having a magnetization direction component opposite to the magnetization direction of the second ferromagnetic layer, the magnetization direction of the third ferromagnetic layer and the magnetization direction of the fourth ferromagnetic layer, which is pinned by a second antiferromagnetic layer, being normal to each other when no magnetic field is applied; and means for detecting an electrical resistance caused by a difference in turns of the magnetization directions of the third and the fourth ferromagnetic layers in the presence of an external magnetic field; and an insulating layer for electrically insulating the first and the second spin valve structures; and means for detecting outputs of the respective spin valve structures.

In the above-described magnetic sensor, it is preferable that differential signal information between the output signals of the first spin valve structure and the second spin valve structure is detected.

In the above-described magnetic sensor, it is preferable that in the first and the second spin valve structures, the magnetization direction of the second and the fourth ferromagnetic layers pinned by the antiferromagnetic layers are anti-parallel with each other.

In the above-described magnetic sensor, it is preferable that the first and the second antiferromagnetic layers have different blocking temperatures from each other.

In the above-described magnetic sensor, it is preferable that the first and the second antiferromagnetic layers are formed of two different kinds of materials selected out of antiferromagnetic regular alloys of iron-manganese, nickel-manganese and palladium-manganese, and out of nickel-oxides.

In the above-described magnetic sensor, it is preferable that the magnetic sensor further comprises a fifth ferromagnetic layer provide between the second or the fourth ferromagnetic layers whose magnetization direction pinned by the first or the second antiferromagnetic layer, and the first or the second antiferromagnetic layer through an antiferromagnetic bonding film of a non-magnetic metal film.

In the above-described magnetic sensor, it is preferable that the first and the second spin valve structures include an insulation layer of an antiferromagnetic material which functions as the first and the second antiferromagnetic thin film layers.

In the above-described magnetic sensor, it is preferable that the antiferromagnetic insulation film is formed of an antiferromagnetic nickel-oxide.

In the above-described magnetic sensor, it is preferable that the magnetic sensor further comprises a fifth ferromagnetic layers provided between the second or the fourth ferromagnetic layers whose magnetization directions pinned by the antiferromagnetic insulation layer, and the insulation layer through an antiferromagnetic bonding film of a non-magnetic metal thin film.

Although it is possible to increase reproduction output, based on addition information from a pair of spin valve structures, based on difference information thermal asperities can be removed while increasing reproduction output.

To form a differential-type output mechanism, it is necessary that in each spin valve structure a magnetization direction of the pinned ferromagnetic layer is 180°. This is realized by the following two methods.

In a first method, in the respective spin valve structures, the switch bias layers of the antiferromagnetic thin films which pin magnetization directions of the ferromagnetic layers are formed of materials having different blocking temperatures from each other, whereby switch bias directions thereof can be set independently of each other. For example, in a case that iron-manganese, and nickel-manganese are used, the iron-manganese has an about 300° C.-blocking temperature, and nickel-manganese has an above 300° C.-blocking temperature. Accordingly, first a switch bias direction of the nickel-manganese layer is set at the high temperature, and then, a switch bias direction of the iron-manganese layer is set in a d.c. magnetic field at a temperature a little higher than the blocking temperature of the iron-manganese, e.g., 230° C. Thus, the respective switch bias directions can be set independently of each other (phase difference: 180°).

In a second method, the fifth ferromagnetic layer is provided between the ferromagnetic layer whose magnetization direction is pinned by the switch bias layer, and the switch bias layer through the antiferromagnetic bonding film of a non-magnetic metal thin film. It is known that in a multi-layer structure of a non-magnetic material/a non-magnetic metal/a ferromagnetic material, as shown in a multi-layer GMR material, the non-magnetic metal layer (antiferromagnetic bonding film) has a suitable thickness, whereby magnetization directions of the two ferromagnetic layers adjacent to each other are anti-parallel with each other. As a preferred embodiment of this, a multi-layer structure of Fe 2 nm/Cr 1.3 nm/Fe 2 nm, Co 2 nm/Cu 0.7 nm/Co 2 nm, etc. provides high antiferromagnetic bonding. Thus, the pinned ferromagnetic layer adjacent to the switch bias layer of an antiferromagnetic material is provided by said antiferromagnetic multi-layer structure, whereby the ferromagnetic layer can have a magnetization direction pinned anti-parallel (phase difference: 180°) which is its intrinsic magnetization direction. Accordingly, the pinned ferromagnetic layer of one spin valve structure has an antiferromagnetic multi-layer structure, whereby the magnetic sensor can have a set of spin valve structures having a 180°-phase difference in one switch bias process (heat treatment in a d.c. magnetic field).

In the multi-layer spin valve magnetic sensor having the above-described structure, output signals from the respective spin valve structures isolated by the insulating layer have inverse phases in response to an external magnetic field. That is, in a first spin valve structure, when a switch bias direction is upward with respect to a magnetic recording medium surface, a switch bias direction of a second spin valve structure is vertically downward with respect to the magnetic recording medium surface. Accordingly, without an external magnetic field, magnetization directions of both pinned ferromagnetic layers form 90°. When a signal magnetic field which is upward with respect to the magnetic recording medium surface acts to the respective free ferromagnetic layers magnetized in one and the same direction, in the first spin valve structure, a magnetization direction of the free ferromagnetic layer turns vertically upward with respect to the magnetic recording medium, i.e., toward the magnetization direction of the pinned ferromagnetic layer, and thus changes to a direction where electric resistance is lower. In a second spin valve structure, a magnetization direction of the free ferromagnetic layer turns in an opposite direction where the magnetization direction becomes anti-parallel with as magnetization direction of the pinned ferromagnetic layer, and thus changes to a direction where electrical resistance is higher. These outputs are detected independently of each other, and are reproduced by a difference amplifying circuit. Thus, the differential spin valve magnetic sensor can be constituted.

The use of the magnetoresistive effect head according to the present invention can provide high reproduction outputs and can remove thermal asperities.

BRIEF DESCRIPTION OF THE DRAWINGS

FIG. 6 is a schematic sectional view of the magnetic sensor according to a second embodiment of the present invention, which show a structure thereof.

FIGS. 7A and 7B are schematic sectional views of the magnetic sensor according to a third embodiment of the present invention, which shows a structure thereof.

FIG. 13 is a view explaining changes of resistance values $r_2$, $r_2$ of the magnetic sensor according to the sixth embodiment of the present invention.

FIG. 16 is a view explaining changes of resistance values $r_2$, $r_3$ of the magnetic sensor according to the seventh embodiment of the present invention.

FIG. 19 is a view explaining changes of resistance values $r_2$, $r_3$ of the magnetic sensor according to the eighth embodiment of the present invention.

DETAILED DESCRIPTION OF THE INVENTION

[A first Embodiment]

The magnetic sensor according to a first embodiment of the present invention will be explained with reference to FIGS. 1 to 3.

Figure 1:
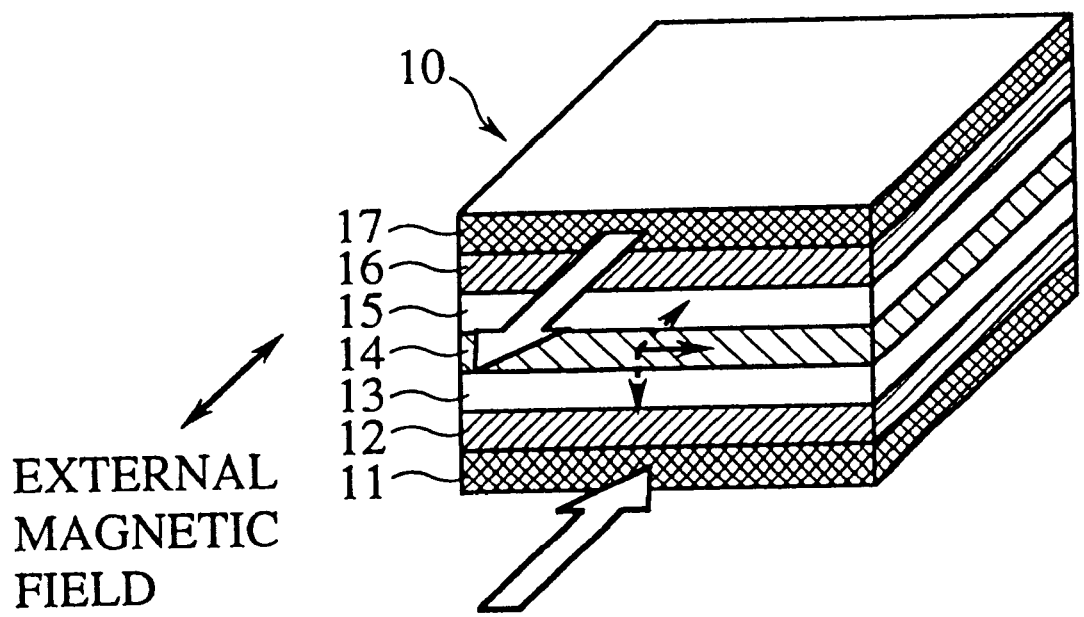
FIG. 1 is a view of a basic structure of the magnetic sensor according to a first embodiment of the present invention.
Figure 2:
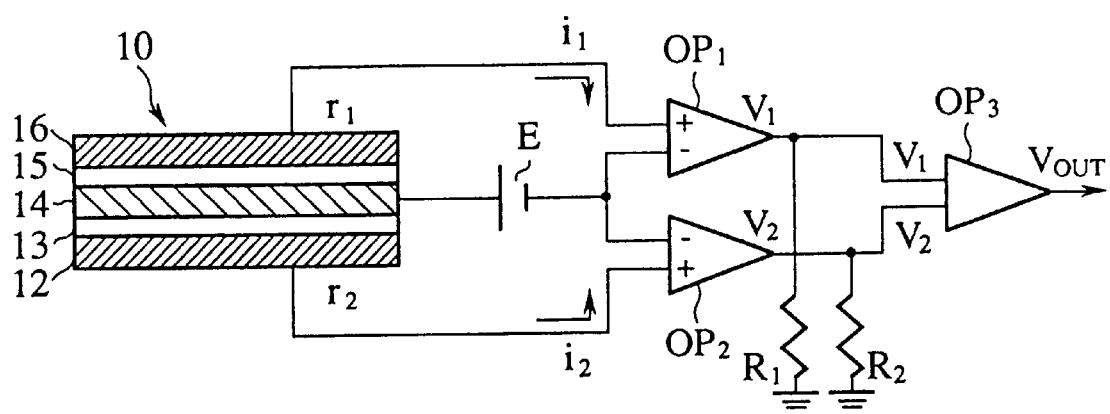
FIG. 2 is a circuit diagram of a detection circuit of the magnetic sensor according to the first embodiment of the present invention.

FIG. 1 is a view of a basic structure of the magnetic sensor according to the present embodiment. FIG. 2 is a circuit diagram of a detection circuit of the magnetic sensor according to the present embodiment. FIGS. 3 and 4 are graphs of magnetoresistance changes and reproduction signal output changes of the magnetic sensor according to the present embodiment due to external magnetic fields.

As shown in FIG. 1, the basic structure of the magnetic sensor according to the present embodiment is a multi-layer body 10 of an antiferromagnetic layer 11 of an antiferromagnetic material, a ferromagnetic layer 12 of a ferromagnetic material having a large coercive force, an insulating layer 13 of an insulating material, a soft magnetic layer of a soft magnetic material having a small coercive force, an insulating layer 15, a ferromagnetic layer 16 of ferromagnetic material having a large coercive force, an antiferromagnetic layer 17 of an antiferromagnetic material laid on another in the stated order. The ferromagnetic layer 12 and the soft magnetic layer 14 constitute a tunnel junction, and the ferromagnetic layer 16 and the soft magnetic layer 14 constitute a tunnel junction.

The antiferromagnetic layer 11 is an about 25 nm-thick NiMn layer; the ferromagnetic layer 12 is an about 20 nm-thick Fe layer; the insulating layer 13 is an about 2 nm-thick $Al_2O_3$ layer; the soft magnetic layer 14 is an about 20 nm-thick NiFe layer; the insulating layer 15 is an about 2 nm-thick $Al_2O_3$ layer; the ferromagnetic layer 16 is an about 20 nm-thick Fe layer; and the antiferromagnetic layer 17 is an about 20 nm-thick FeMn layer.

The antiferromagnetic layers 11, 17 may be formed of another antiferromagnetic material, e.g., an irregular FeMn alloy, a regular NiMN alloy, PdMn alloy, PtMn alloy, MnO having NaCl structure, or NiO, etc. The ferromagnetic layers 12, 16 may be formed of another ferromagnetic material, e.g., Co, Ni, or an alloy of Fe, Co and/or Ni of an above 50 Oe (oersted) coercive force. The soft magnetic layer 14 is formed of another soft magnetic material, e.g., CoFe alloy of a below about 10 Oe coercive force. The insulating layers 13, 15 may be formed of another insulating body, e.g., $SiO_2$, AlN, NiO, CoO or others.

As shown in FIG. 1, the antiferromagnetic layer 11 is pinned so that a magnetization direction of the ferromagnetic layer 12 is oriented from the front of the sheet of the drawing to the back thereof, and the antiferromagnetic layer 17 is pinned so that a magnetization direction of the ferromagnetic layer 16 is oriented from the back of the sheet of the drawing to the front thereof, whereby the magnetization of the ferromagnetic layer 12 and that of the ferromagnetic layer 16 are pinned in opposite directions to each other.

The soft magnetic layer 14 has a small coercive force, and can rotate its magnetization direction freely in accordance with external magnetic fields. A direction of an axial of easy magnetization of the soft magnetic layer 14 is substantially normal to the magnetization direction of the ferromagnetic layer 12 and that of the ferromagnetic layer 16. A saturation magnetic field for the soft magnetic layer 14 in an axis of difficult magnetization is about 5 Oe and is preferably smaller than a coercive force (about 30 Oe) of the ferromagnetic layer 12 and the ferromagnetic layer 16.

The ferromagnetic layer 12 and the ferromagnetic layer 16 are adjusted in their ferromagnetic materials and film thickness, whereby a static magnetic field due to the ferromagnetic layer 12 and a static magnetic field due to the ferromagnetic layer 16 can compensate each other in the soft ferromagnetic layer 14. Thus, the soft magnetic layer 14 can change its own magnetization direction in accordance with external magnetic fields without generating static magnetic energy.

The detection circuit for detecting reproduction signals used in the magnetic sensor according to the first embodiment of the present invention will be explained.

When a resistance of the tunnel junction between the ferromagnetic layer 16 of the multi-layer body 10 of the magnetic sensor and the soft magnetic layer 14 thereof is represented by $r_1$, and a resistance of the tunnel junction between the soft magnetic layer 14 and the ferromagnetic layer 12 is represented by $r_2$, resistances $r_1$, $r_2$ change due to spin tunnel phenomena when the soft magnetic layer 14 changes its magnetization direction due to an external magnetic field.

When an external magnetic field is applied, and a magnetization direction of the soft magnetic layer 14 turns, compensatively a resistance $r_1$, $r_2$ of one of the tunnel junctions becomes higher, a resistance $r_1$, $r_2$ of the other of the tunnel junctions becomes lower. In the present embodiment, a difference between changes of the thus compensatively varying resistances are given, so that higher magnetic field detecting sensitivity is obtained, and noise components generating in a same phase, so as to obtain drastically improved signal-to-noise ratio.

A positive voltage E is applied from a d.c. electric power source E to the soft magnetic layer 14, a current $i_1$ flowing between the ferromagnetic layer 16 and the soft magnetic layer 14 is amplified by an operational amplifier $OP_1$, and a current $i_2$ flowing between the ferromagnetic layer 12 and the soft magnetic layer 14 is amplified by an operational amplifier $OP_2$. Outputs $V_1$, $V_2$ of the operational amplifiers $OP_1$, $OP_2$ are given by the following formulas.

$$V_1 = \alpha_1 \times i_1 = \alpha_1 \times E/r_1$$

$$V_1 = \alpha_1 \times i_2 = \alpha_2 \times E/r_2$$

wherein $\alpha_1$ is an amplifying ratio of the operational amplifier $OP_1$, $\alpha_2$ is an amplifying ratio of the operational amplifier $OP_2$.

Outputs $V_1$, $V_2$ of the operational amplifiers $OP_1$, $OP_2$ are grounded respectively through resistors $R_1$, $R_2$. A difference between outputs $V_1$, $V_2$ of the operational amplifiers $OP_1$, $OP_2$ is differentially amplified by an operational amplifier $OP_3$, and a reproduction output signal $V_{out}$ is given by the following formula.

$$V_{out} = \alpha_3 (V_1 - V_2)$$

wherein $\alpha_3$ is an amplifying ratio of the operational amplifier $OP_3$.

Figure 3:
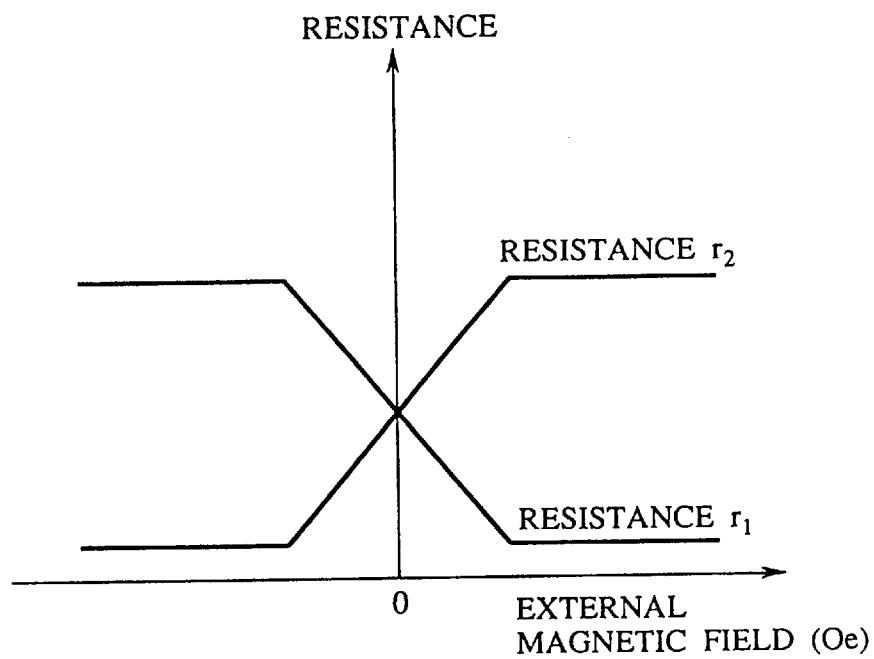
FIG. 3 is a graph of magnetoresistive effect changes of the magnetic sensor according to the first embodiment of the present invention in response to external magnetic fields.
Figure 4:
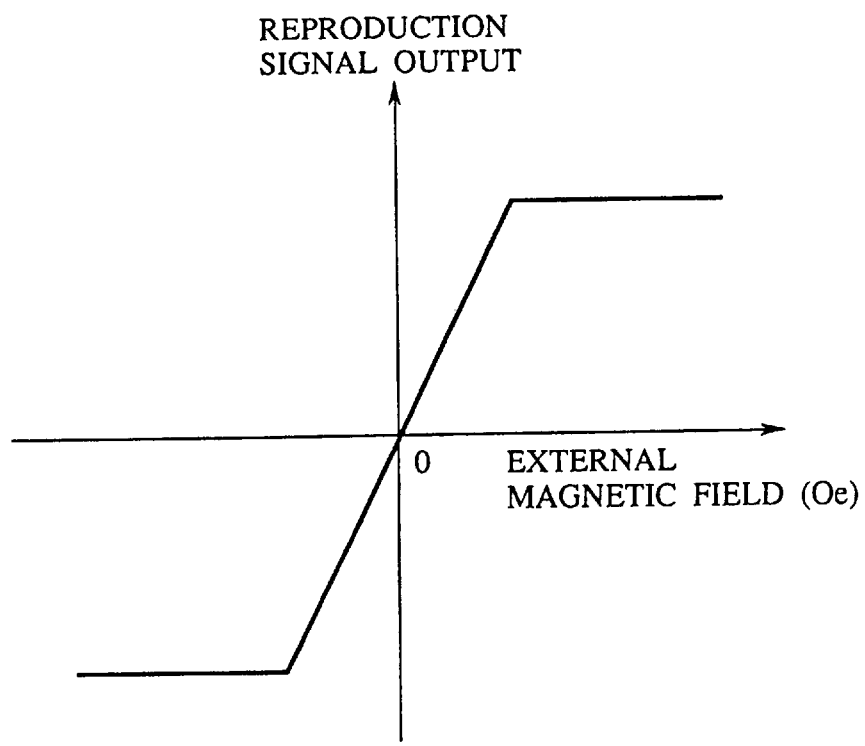
FIG. 4 is a graph of reproduction signal output changes of the magnetic sensor according to the first embodiment of the present invention in response to external magnetic fields.

Changes of resistance $r_1$, $r_2$ corresponding to external magnetic field changes are shown in FIG. 3, and changes of reproduction signals $V_{out}$ are shown in FIG. 4. In FIGS. 3 and 4, an external magnetic field oriented from the back of the sheet of FIG. 1 to the front thereof is positive, and an external magnetic field oriented in the direction opposite thereto is negative.

Without an external magnetic field applied to, a magnetization direction of the soft magnetic filed layer 14 is the initial axis of easy magnetization, and as shown in FIG. 3, resistances $r_1$, $r_2$ are equal to each other. Accordingly outputs $V_1$, $V_2$ are equal to each other, and as shown in FIG. 4, a reproduction output $V_{out}$ is zero.

When a positive external magnetic field is applied, a magnetization direction of the soft magnetic layer 14 is turned from the initial axis of easy magnetization, i.e., from the back of the sheet of FIG. 1, to the front thereof. Resultantly, as shown in FIG. 3, a resistance $r_1$ of the tunnel junction between the ferromagnetic layer 16 and the soft magnetic layer 14 is decreased, and a resistance $r_2$ of the tunnel junction between the soft magnetic layer 14 and the ferromagnetic layer 12 is increased. Accordingly, an output $V_1$ is increased, an output $V_2$ being decreased, and as shown in FIG. 4, a reproduction output $V_{out}$ has a positive value. As the external magnetic field intensifies, the reproduction output $V_{out}$ is increase, and when the magnetization direction is oriented from the back of the sheet to the front, changes of the resistance stop, and the reproduction output saturated.

When a negative external magnetic field is applied, a magnetization direction of the soft magnetic layer 14 is turned from the initial axis of easy magnetization, i.e., from the front of the sheet of FIG. 1, to the back thereof. Resultantly, as shown in FIG. 3, a resistance $r_1$ of the tunnel junction between the ferromagnetic layer 16 and the soft magnetic layer 14 is increased, and a resistance $r_2$ of the tunnel junction between the soft magnetic layer 14 and the ferromagnetic layer 12 is decreased. Accordingly, an output $V_1$ is decreased, an output $V_2$ being increased, and as shown in FIG. 4, a reproduction output $V_{out}$ has a negative value. As the external magnetic field intensifies, the reproduction output $V_{out}$ is decreased, and when the magnetization direction is oriented from the front of the sheet to the back, changes of the resistance stop, and the reproduction output saturated.

Figure 5A:
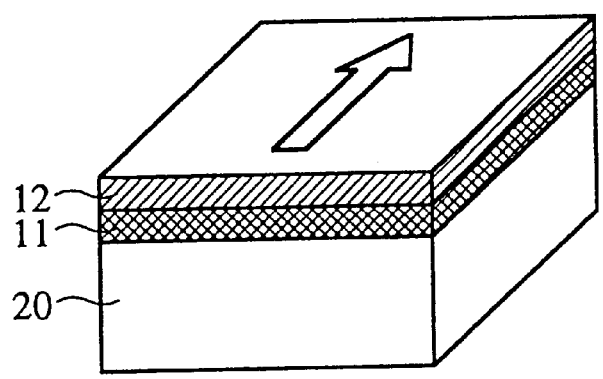
FIGS. 5A–5C are views of the magnetic sensor according to the first embodiment of the present invention at the steps of a method for fabricating the same, which explain the method.

Then, a method for fabricating the magnetic sensor according to the present embodiment will be explained with reference to FIGS. 5A–5C.

First, an about 25 nm-thick NiMn layer as the antiferromagnetic layer 11 is deposited by sputtering on a support substrate 20, as of a glass substrate or others. Then, an about 20 nm-thick Fe layer as the ferromagnetic layer 12 is deposited (FIG. 5A). Then, with an about 2000 Oe magnetic field being applied in the direction of the arrow in FIG. 5A (from the front of the sheet to the back thereof), a heat treatment is conducted for about 1 hour at about 300° C. The NiMn layer is regularized to be antiferromagnetic, and a magnetization direction of the Fe layer is pinned in the direction of the applied magnetic field.

Figure 5B:
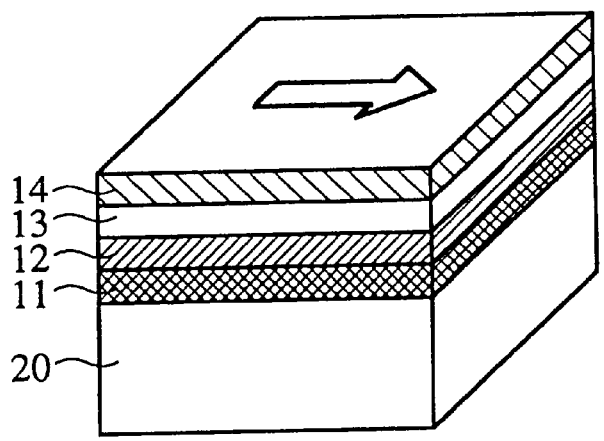

Next, Al is deposited in an about 5 nm-thickness by sputtering and is heat-treated for 1 hour in a 100 mTorr oxygen atmosphere to form the insulation layer 13 (FIG. 5B). Subsequently with an about 100 Oe magnetic field being applied in the direction of the arrow in FIG. 5B (from the left of the sheet to the right), an about 20 nm-thick NiFe layer as the soft magnetic layer 14 is deposited by sputtering. Thus, the axis of easy magnetization of the soft magnetic layer 14 is turned in the direction of the applied magnetic field.

Figure 5C:
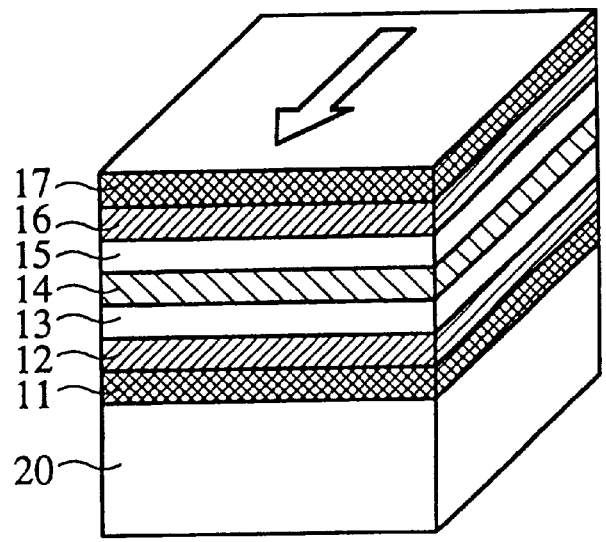

Then, Al is deposited in an about 5 nm-thickness by sputtering and oxidized to be the insulating layer 15 FIG. 5C). Subsequently with an about 100 Oe magnetic field being applied in the direction of the arrow in FIG. 5C (from the back of the sheet to the front), an about 20 nm-thick NiFe layer as the ferromagnetic layer 16 is deposited by sputtering, and then an about 20 nm-thick FeMn layer as the antiferromagnetic layer 17 is deposited.

The FeMn layer is deposited to be antiferromagnetic and requires no heat treatment following the deposition. Magnetization directions of the NiFe layers become the direction of the applied magnetic field, and magnetized state of the FeMn layer is determined under the influence of the magnetization direction of the NiFe layers. The magnetization direction of the NiFe layer as the ferromagnetic layer 16 is pinned by the FeMn layer as the antiferromagnetic layer 17.

The thus-formed multi-layer body is patterned by lithography into an about 10 $\mu$m-square to form a tunnel junction.

To pin the magnetization direction of the ferromagnetic layer by the antiferromagnetic layer, as described above, the antiferromagnetic layer and the ferromagnetic layers may be heat-treated in a magnetic field after the deposition, or the ferromagnetic layer is deposited in a magnetic field and then the antiferromagnetic layer is deposited on the ferromagnetic layer.

The present invention is not limited to the first embodiment and covers other modifications.

For example, in the first embodiment, the two ferromagnetic layers have magnetization directions which are substantially opposite to each other, but the magnetization directions may not be perfectly opposite to each other and may be different from each other. For example, the magnetization directions of the two ferromagnetic layers are normal to each other, the axis of easy magnetization of the soft magnetic layer is interposed between the magnetization direction of the two ferromagnetic layers.

In the first embodiment, the axis of easy magnetization of the soft magnetization layer is substantially normal to the magnetization directions of the two ferromagnetic layers but the axis of each magnetization of the soft magnetic layer may be another direction.

In the first embodiment, both two ferromagnetic layers are pinned by the antiferromagnetic layer but may be pinned by either of the ferromagnetic layers. Unless magnetization directions of the ferromagnetic layers are not changed by external magnetic fields, the antiferromagnetic layer for the pinning may not be included.

[A Second Embodiment]

A magnetic sensor according to a second embodiment of the present invention will be explained with reference to FIG. 6.

FIG. 6 is a sectional view of the magnetic sensor according to the present embodiment, which shows a structure thereof.

The present embodiment relates to a diffusion preventive layer of a magnetoresistive effect device using spin valve film.

First, a 5 nm-thick Ta ground layer 22 is deposited on a Si substrate having (100) face as the primary facet. Then, on the ground layer 22, a 9 nm-thick NiFe magnetic layer 23 as a free layer, a 0.6 nm-thick Ag diffusion preventive layer 24, and a 4 nm-thick Cu non-magnetic layer 25 are sequentially deposited. Furthermore, a 0.6 nm-thick Ag diffusion preventive layer 26 is deposited, and on the diffusion preventive layer 26, a 4 nm-thick NiFe magnetic layer 27 as a pin layer, and a 10 nm-thickness FeMn antiferromagnetic layer 28 for pinning a magnetization direction of the magnetic layer 27 are deposited. Then, the multi-layer body is patterned, using a resist mask to form a spin valve film. Next, the magnetoresistive effect device for a magnetic head is fabricated by the same fabrication process as that for a usual magnetoresistive effect device including spin valve film. In the above-described deposition steps, the magnetic layers 23, 27, and the antiferromagnetic layer 28 are deposited by sputtering in a magnetic field applied parallelly with the surface of the substrate 21 so as to restrict axes of easy magnetization of the magnetic layers 23, 27 and the antiferromagnetic layer 28.

In the second embodiment, the magnetoresistive effect is little decreased by heat treatments conducted in the following magnetic head fabrication process. The magnetoresistive effect is higher than that of the spin valve film including Ag as the nonmagnetic layer.

[A Third Embodiment]

The magnetic sensor according to a third embodiment of the present invention will be explained with reference to FIG. 7.

FIG. 7 is a sectional view of the magnetic sensor according to the present embodiment, which shows a structure thereof.

The present embodiment includes the non-magnetic layer 25 of the first embodiment in a multi-layer film of alternate layers of Cu thin films 25a and Ag thin films 25b.

First, as in the second embodiment, a 5 nm-thick Ta ground layer 22 and a 9 nm-thick NiFe magnetic layer 23 are deposited on a (100) Si substrate 21, and then a 0.4 nm-thick Ag diffusion preventive layer 24 is deposited. Subsequently, 4 layers of a 0.4 nm-thick Cu thin film 25a, and 3 layers of an 0.4 nm-thick Ag thin film 25b are alternately laid one on another to form a 2.8 nm-thick non-magnetic layer 25. The top layer of the non-magnetic layer 25 is the Cu thin film 25a. Next, a 0.4 nm-thick Ag diffusion preventive layer 26 deposited. On the diffusion preventive layer 26, as in the second embodiment, a 4 nm-thick NiFe magnetic layer 27 and a 10 nm-thick FeMn antiferromagnetic layer 28 are deposited. The same deposition technique as in the second embodiment is used.

The spin valve film of the present embodiment exhibits a middle magnetoresistance change ratio between that of the spin valve film including the non-magnetic layer of Ag and that of the spin valve film including the non-magnetic layer of Cu. The spin valve film of the present embodiment has good heat resistance.

[A Fourth Embodiment]

The magnetic sensor according to a fourth embodiment of the present invention will be explained with reference to FIG. 8.

Figure 8:
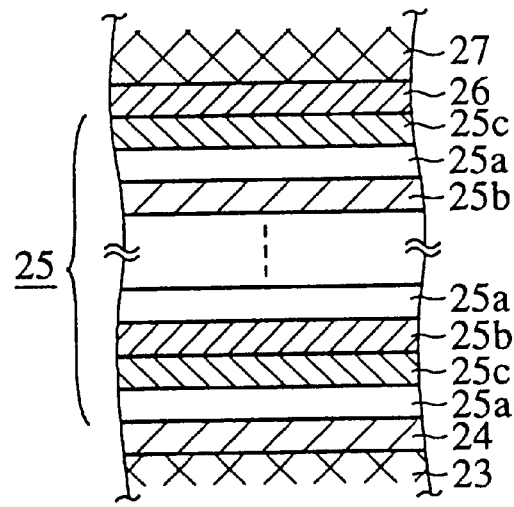
FIG. 8 is a schematic sectional view of the magnetic sensor according to a fourth embodiment of the present invention.

FIG. 8 is a sectional view of the magnetic sensor according to the present embodiment, which shows a structure thereof.

The present embodiment relates to a spin valve film which includes a corrosion resistant metal thin film 25c in a non-magnetic layer 25 of a multi layer film of alternately laid Cu thin films 25a and Ag thin films 25b.

First, as in the third embodiment, an Si substrate 21 having (100) face as the primary facet, a ground layer (not shown) of Ta, and an NiFe magnetic layer 23 are deposited, and on the magnetic layer 23 a 0.4 nm-thick Ag diffusion preventive layer 24 is deposited. Then, three sets of a three-layer structure of a 0.4 nm-thick Cu thin film 25a/a 0.2 nm-thick corrosion resistant metal film 25c/a 0.4 nm-thick Ag thin film 25b are laid one on another to deposit a 0.3 nm-thick multi-layer film. The top Ag thin film 25b of the multi-layer film is a diffusion preventive layer 26, and the rest part of the multi-layer film is a non-magnetic layer 25. Then, as in the third embodiment, an NiFe layer 27 and an FeMn antiferromagnetic film (not shown) are deposited to form the spin valve film.

In the present embodiment, for more improved heat resistance, the corrosion resistant metal film 25c may be provided between the respective Cu thin films 25a and the respective Ag layers. For example, the corrosion resistant metal film 25c may be provided between the Cu thin films 25a and diffusion preventive films 24, 26, and/or between the Cu thin films 25a and the Ag thin films 25b. It is needless to say that as described above, the heat resistant metal thin film 25c may be provided between arbitrary layers of the non-magnetic layer 25.

[A Fifth Embodiment]

The magnetic sensor according to a fifth embodiment of the present invention will be explained with reference to FIG. 9.

Figure 9:
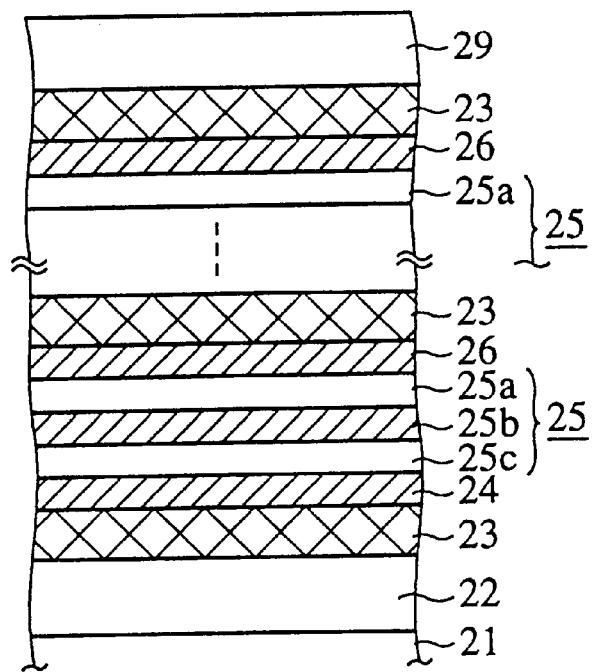
FIG. 9 is a schematic sectional view of the magnetic sensor according to a fifth embodiment of the present invention.

FIG. 9 is a sectional view of the magnetic sensor according to the present embodiment, which shows a structure thereof.

The present embodiment relates to a magnetoresistive effect device including a superlattice GMR film.

First, a 5 nm-thick Cu ground layer 22 is deposited on an Si substrate 21 having (100) face as the primary facet. Then, a 1 nm-thick Co magnetic layer 23 is deposited on the ground layer 22. Next, a 0.2 nm-thick Ag diffusion preventive layer 24 is deposited. Then, a 0.2 nm-thick Cu thin film 25a, a 0.2 nm-thick Ag thin film 25b and a 0.2 nm-thick Cu thin film 25a are sequentially deposited to form a 0.6 nm-thick non-magnetic layer 25 of a multi-layer film of alternately deposited Cu thin films 25a and Ag thin films 25b. Next, a 0.2 nm-thick Ag diffusion preventive layers 26 are deposited. Thus is formed a superlattice structure including the magnetic layer 23/the diffusion preventive layer 24/the multi layer non-magnetic layer 25/ the diffusion preventive layer 26 as one unit on the ground layer 22.

Next, 20 units of the thus-formed superlattice structure are laid one on another, and a 1 nm-thick Co magnetic layer 23 is deposited. Furthermore, a 5 nm-thick Cu cap layer 29 is deposited on the magnetic layer 23 to form the superlattice GMR film. Then, the magnetoresistive effect device for a magnetic head is fabricated by the known process.

[A Sixth Embodiment]

The magnetic sensor according to a sixth embodiment of the present invention will be explained with reference to FIGS. 10 to 13.

Figure 10:
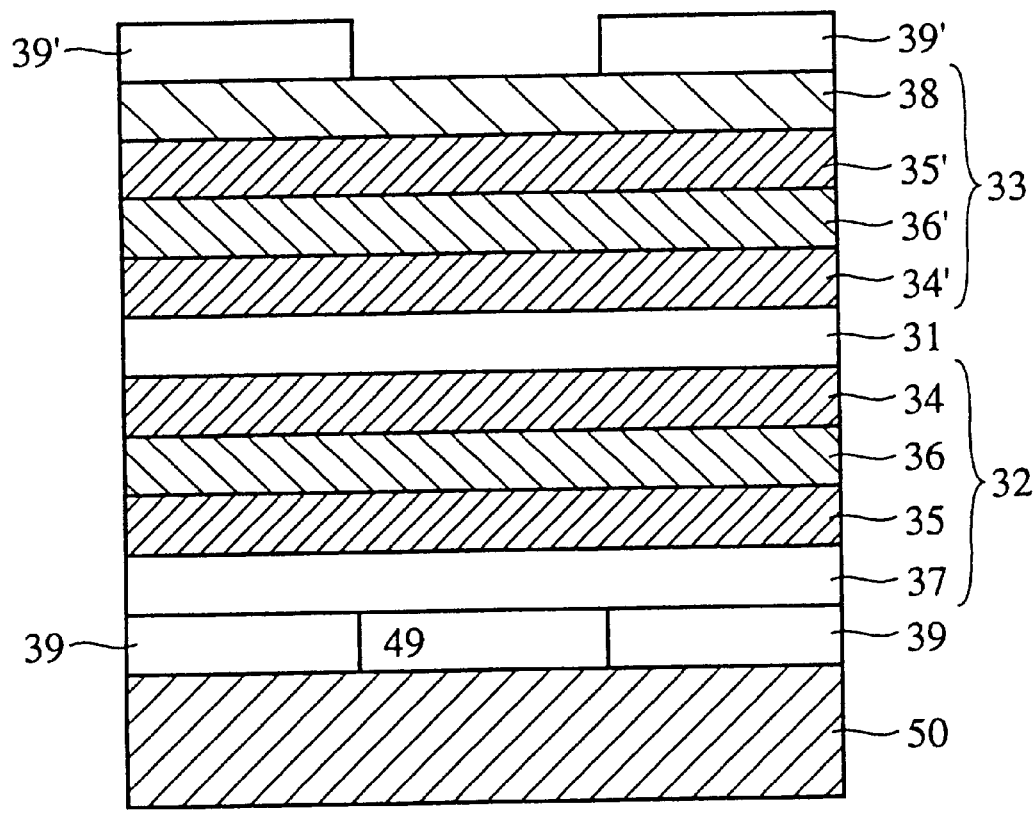
FIG. 10 is a schematic sectional view of the magnetic sensor according to a sixth embodiment of the present invention.
Figure 11:
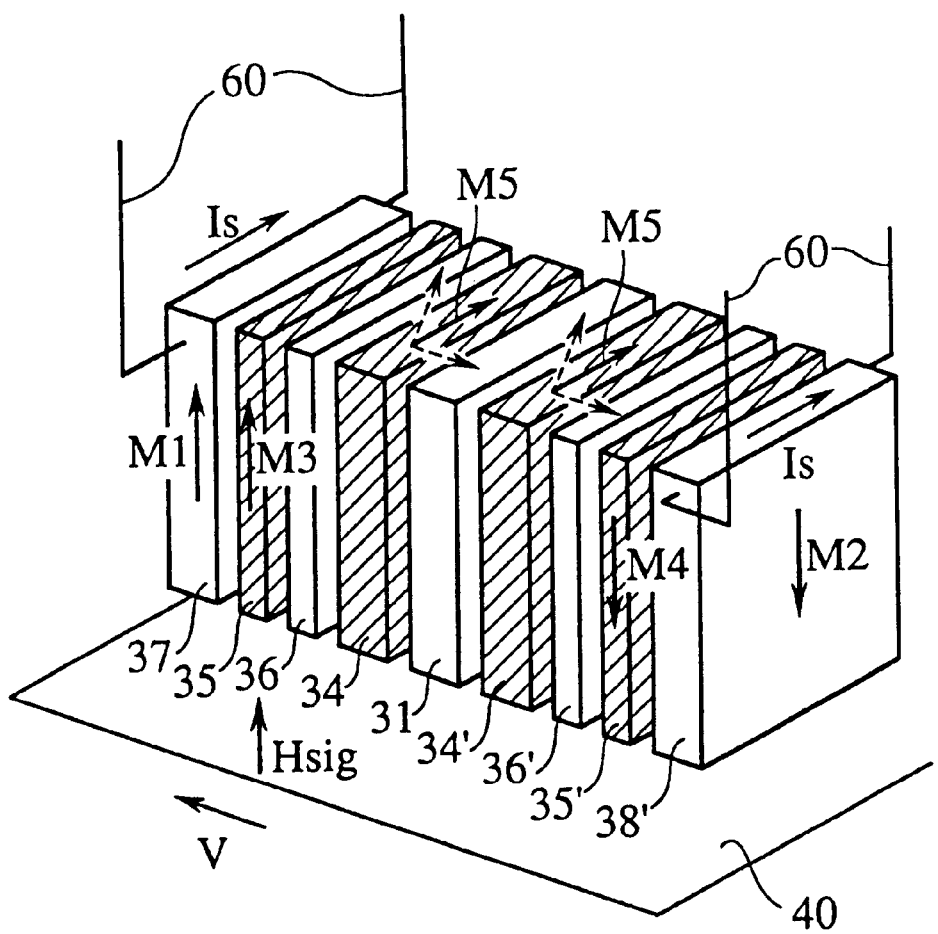
FIG. 11 is a development of the magnetic sensor according to the sixth embodiment of the present invention.
Figure 12:
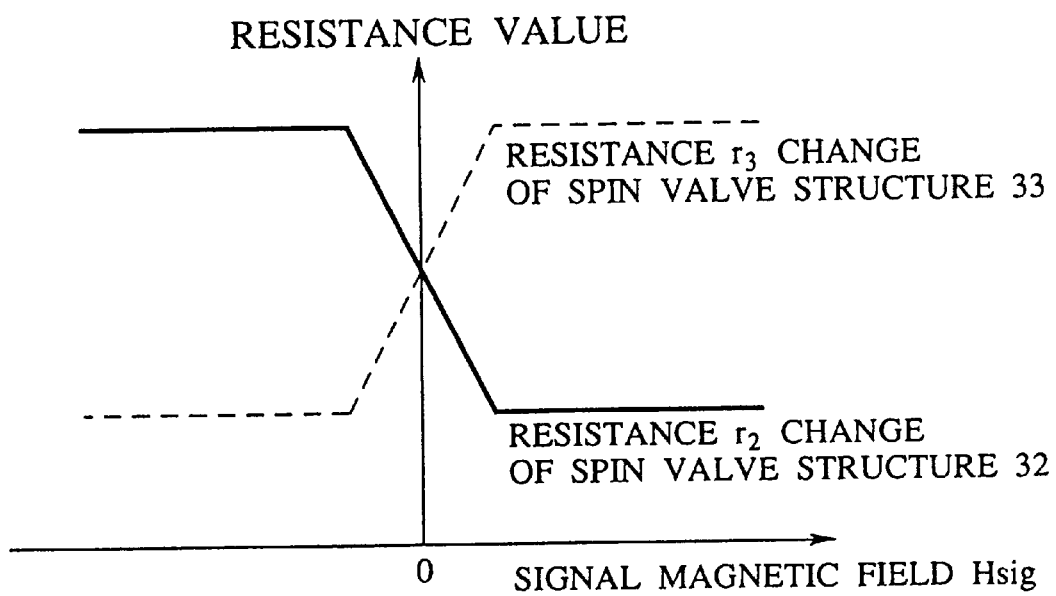
FIG. 12 is a graph of outputs of the magnetic sensor according to the sixth embodiment of the present invention.

FIG. 10 is a schematic diagram of the magnetic sensor according to the present embodiment, which shows a structure thereof. FIG. 11 is a developed off the magnetic sensor according to the present embodiment, which show the structure thereof. FIG. 12 is a graph of outputs of the magnetic sensor according to the present embodiment. FIG. 13 is a view explaining resistance values $r_2$, $r_3$ of the magnetic sensor according to the present embodiment.

FIG. 10 shows the structure of the present embodiment. Reference numeral 31 represents an $Al_2O_3$ insulating film, and a pair of spin valve structures 32, 33 are laid one on another with the $Al_2O_3$ insulating film therebetween. The spin valve structure 32, 33 are each a multi-layer structure including a Cu spacer layer 36 interposed between $Ni_{81}Fe_{19}$ magnetic films 34, 35. In the spin valve structure 32 a $Ni_{30}Mn_{50}$ switch bias layer 37 is laid, and a $Fe_{50}Mn_{30}$ switch bias layer 38 is laid in the spin valve structure 33. It is possible that the magnetic films 34, 35 are formed of one or more kinds of magnetic metal film of Ni, Fe, Co and alloys of these metals.

It is also possible that the spacer layer 36 may be a metal film of a metal selected from a non-magnetic metal groups of Au, Ag, Cu and alloys of these metals. It produces the same effect to use different magnetic films and spacer films in the spin valve structures 32, 33.

On a substrate 50 with a pair of electrodes 39 formed on through an insulating film 49, a 10 nm-thick $Ni_{50}Mn_{50}$ antiferromagnetic film 37, a 4 nm-thick $Ni_{81}Fe_{19}$ magnetic film 35, a 2 nm-thick Cu spacer layer 36, a 10 nm-thick $Ni_{81}Fe_{19}$ magnetic film 34, a 20 nm-thick $Al_2O_3$ insulation film 31, a 10 nm-thick $Ni_{81}Fe_{19}$ magnetic film 34', a 2 nm-thick Cu spacer layer 36', a 4 nm-thick $Ni_{81}Fe_{19}$ magnetic film 35' and an 10 nm-thick $Fe_{50}Mn_{50}$ antiferromagnetic film 38 are laid one on another, and further a pair of electrodes are formed thereon. This multi-layer body can be formed by any of sputtering, ion beam sputtering, vapor deposition or other techniques. This multi-layer body can be processed into the device by ion milling or other technique using the usual photo lithography.

As shown in FIG. 11, a sense current $I_3$ flows in a direction of width of a track, and a signal magnetic field $H_{cig}$ from a magnetic recording medium 40 enters in a direction which is parallel with the multi-layer interface and perpendicular to the sense current $I_c$. In FIG. 11, V represents a direction of movement of the medium, and 60 indicates a lead. $Ni_{50}Mn_{50}$ switch bias layer 37 and the $Fe_{50}Mn_{50}$ switch bias layer 38 have anti-parallel magnetic anisotropy M1, M2, so that the magnetic films 35, 35' respectively adjacent to the switch bias layers 37, 38 have magnetization directions thereof pinned in directions anti-parallel with each other M3, M4. A magnetization direction of the magnetic films 34, 34' laid between the Cu spacer layers 36, 36' is an axis of easy magnetization M5 set in the direction of flow of the sense current $I_c$ in the absence of an external magnetic field.

When a vertical signal magnetic field $H_{cig}$ enters the magnetic sensor from the magnetic recording medium 40, the magnetization directions M3, M4 of the magnetic films 35, 35', which are pinned respectively by the switch bias layers 37, 38, do not change, but a magnetization direction of the magnetic films 34, 34' turns in plane of the magnetic films 34, 34' by a direction of the signal magnetic field $H_{sig}$. When the signal magnetic field $H_{sig}$ is directed upward, the magnetization direction of the magnetic films 34 turns to be nearer the magnetization direction M3 in plane of the magnetic film 34, and the magnetization direction of the magnetic film 34' turns to be nearer the opposite direction to the magnetization direction M4 in plane of the magnetic film 34'. the magnetization directions M3, $M_5^2$ are substantially the same directions, and the spin valve structure 32 has smaller resistance value $r_2$. The magnetization direction M4, $M_5^3$ are substantially opposite to each other, and the spin valve structure 33 has larger resistance value $r_3$. When the signal magnetic field $H_{sig}$ is directed downward, the magnetization direction of the magnetic film 34 turns to be nearer the opposite direction to the magnetization direction M3 in plane of the magnetic film 34, and the magnetization direction of the magnetic film 34' turns to be nearer the magnetization direction M4 in plane of the magnetic film 34'. The magnetization direction M3, $M_5^2$ are substantially opposite to each other, and the spin valve structure 32 has larger resistance value $r_2$. The magnetization directions M4, $M_6^2$ are substantially the same direction, and the spin valve structure 33 has smaller resistance value $r_3$. FIG. 12 shows signal magnetic field $H_{cig}$ dependence of respective resistance values $r_2$, $r_3$ of the spin valve structures 32, 33. Because the spin valve structures 32, 33 exhibit symmetric electric resistance changes in response to the same signal magnetic field $H_{cig}$, output signals of the spin valve structures 32, 33 are detected independently of each other, so that the magnetic sensor operates as a differentially operative magnetic sensor.

Changes of resistance values $r_2$, $r_3$ of the magnetic sensor according to the present embodiment are summarized in FIG. 13.

[A Seventh Embodiment]

The magnetic sensor according to a seventh embodiment of the present invention will be explained with reference to FIGS. 14 to 16.

Figure 14:
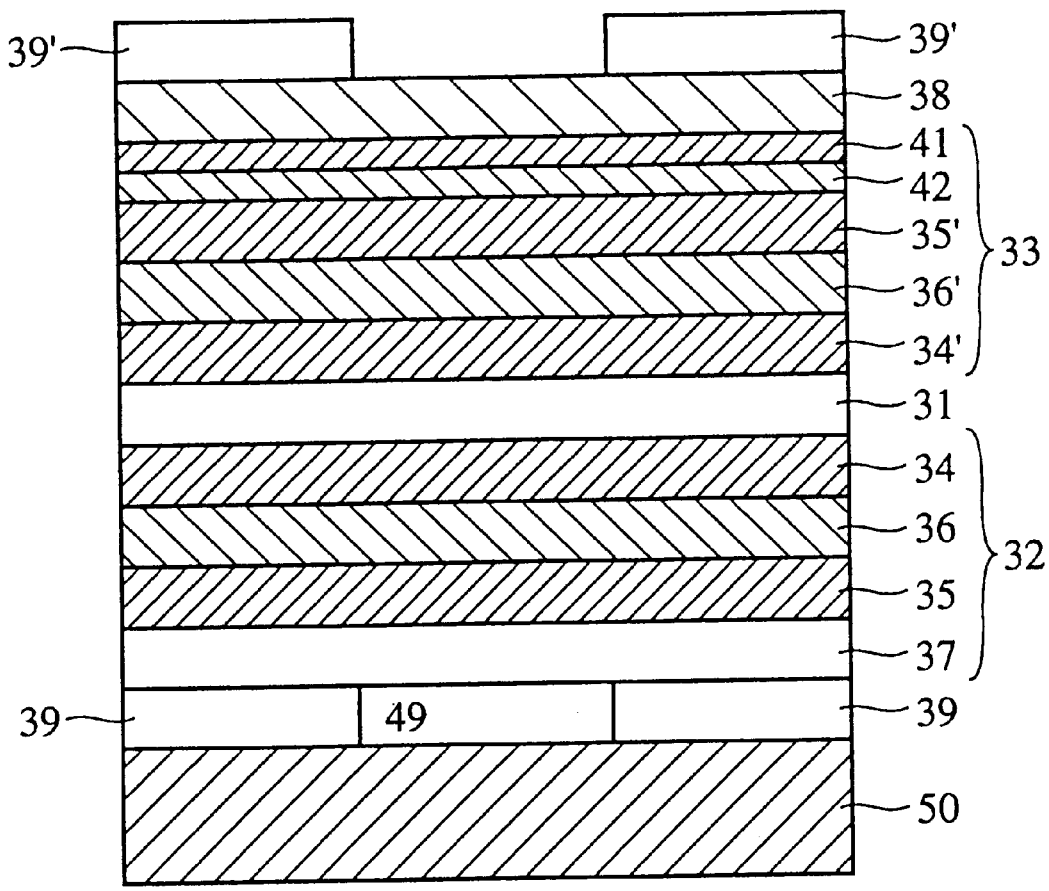
FIG. 14 is a schematic sectional view of the magnetic sensor according to a seventh embodiment of the present invention, which shows a structure thereof.

FIG. 14 is a schematic sectional view of the magnetic sensor according to the present embodiment, which shows a structure thereof. FIG. 15 is a development of the magnetic sensor according to the present embodiment, which shows the structure thereof. FIG. 16 is a view explaining changes of resistance values $r_2$, $r_3$ of the magnetic sensor according to the present embodiment.

In FIG. 14, reference numeral 31 represent an $Al_2O_3$ insulation film, and a pair of spin valve structures 32, 33 are laid on both sides of the $Al_2O_3$ insulation film 31. Each spin valve structure 32, 33 is a multi-layer structure including a Cu spacer layer 36 interposed between $Ni_{81}Fe_{19}$ magnetic layers 34, 35, and $Ni_{50}Mn_{50}$ switch bias layers 37, 38. In the spin valve structure 33 the magnetic layer 35 is laid on the switch bias layer 38 through the Cu antiferromagnetic bonding film 42 and a magnetic film 41. The switch bias layers 37, 38 may be formed of the same antiferromagnetic material. The other magnetic films 34, 35, and the non-magnetic layer 36 are the same as those of the sixth embodiment.

On a substrate 50 with a pair of electrodes 39 formed on through an insulating film 49, a 10 nm-thick $Ni_{50}Mn_{50}$ antiferromagnetic film 37, a 4 nm-thick $Ni_{81}Fe_{19}$ magnetic film 35, a 2 nm-thick Cu spacer layer 36, a 10 nm-thick $Ni_{81}Fe_{19}$ magnetic film 34, a 20 nm-thick $Al_2O_3$ insulation film 31, a 10 nm-thick $Ni_{81}Fe_{19}$ 34', a 2 nm-thick Cu spacer layer 36', a 4 nm-thick $Ni_{81}Fe_{19}$ magnetic film 35', a 1 nm-thick Cu antiferromagnetic bonding film 42, a 12 nm-thick $Ni_{81}Fe_{19}$ magnetic film 41, and a 10 nm-thick $Ni_{50}Mn_{50}$ antiferromagnetic film 38 are laid one on another, and a pair of electrodes 39 are formed thereon.

Figure 15:
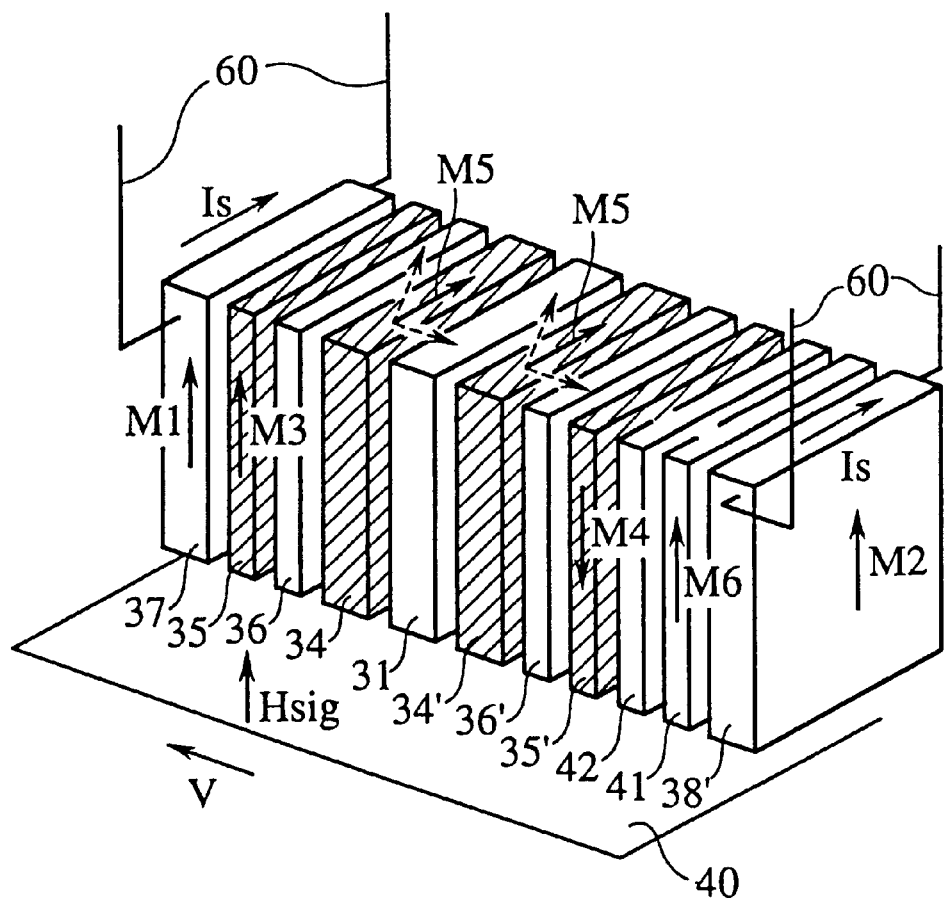
FIG. 15 is a development of the magnetic sensor according to the seventh embodiment, which shows the structure thereof.

As shown in FIG. 15, sense current $I_c$ flows in a direction of width of a track, and a signal magnetic field $H_{cig}$ from a magnetic recording medium 40 enters in a direction parallel with the laid surface and perpendicular to the sense current $I_s$. The switch bias layers 37, 38 have magnetic anisotropy M1, M2 in the same direction. Magnetization directions of the magnetic films 35, 41 respectively adjacent to the switch bias layers 37, 38 are pinned in the same magnetization directions M3, M6. In the spin valve structure 33, strong antiferromagnetic bonding is caused in the magnetic films 35', 41 through the Cu antiferromagnetic bonding film 42, and a magnetization direction of the magnetic film 35' is pinned in the magnetization direction M6 of the magnetic film 41, i.e., in the magnetization direction M4 anti-parallel with the magnetization direction M2 of the switch bias layer 38. A magnetization direction of the magnetic films 34, 34' is an axis of easy magnetization M5 pinned in the direction of flow of the sense current $I_s$ when an external magnetic field is absent.

When a vertical signal magnetic field $H_{sig}$ enters the magnetic sensor from a magnetic recording medium 40, magnetization directions of the magnetic films 35, 35' are pinned by the switch bias layers 37, 38 and does not change, but a magnetization direction of the magnetic films 34, 34' is turned by synthesis of the magnetization direction M5 and the signal magnetic field $H_{cig}$ in plane of the magnetic films 34, 34'. Because signal magnetic field dependence $H_{nig}$ of resistance values $r_2$, $r_3$ of the spin valve structures 32, 33 exhibit, as shown in FIG. 12, symmetric electric resistance changes in response to the same signal magnetic field $H_{zig}$, output signals of the spin valve structures 32, 33 are detected independently of each other, so that the magnetic sensor operates as a differentially operative magnetic sensor.

Changes of resistance values $r_2$, $r_3$ of the magnetic sensor according to the present embodiment are summarized in FIG. 16.

[An Eighth Embodiment]

The magnetic sensor according to an eighth embodiment of the present invention will be explained with reference to FIGS. 17 to 19.

Figure 17:
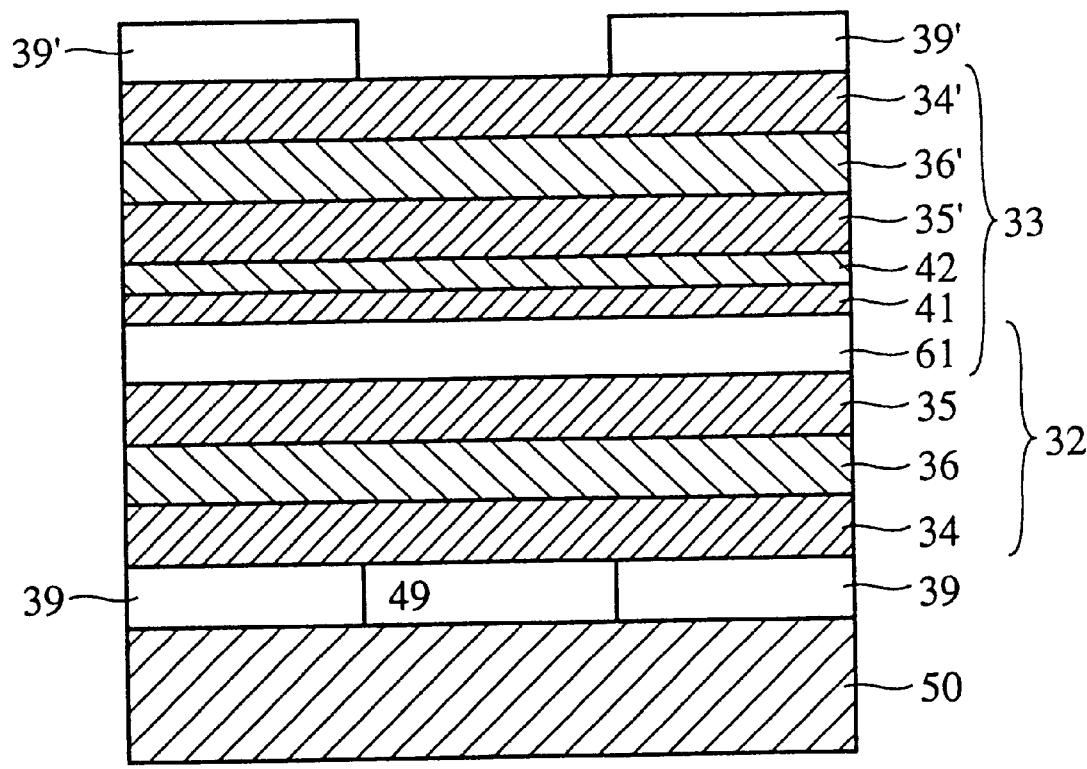
FIG. 17 is a schematic sectional view of the magnetic sensor according to an eighth embodiment of the present invention, which shows a structure thereof.

FIG. 17 is a schematic sectional view of the magnetic sensor according to the present embodiment, which show a structure thereof. FIG. 18 is a development of the magnetic sensor according to the present embodiment, which shows the structure thereof. FIG. 19 is a view explaining changes of resistance values $r_2$, $r_3$ of the magnetic sensor according to the present embodiment.

In FIG. 17, reference numeral 61 represents an NiO insulating switch bias layer interposed between a pair of spin valve structures 32, 33. The spin valve structure 32, 33 are each a multi-layer structure including a Cu spacer layer 36 between $Ni_{81}Fe_{19}$ magnetic films 34, 35. The eighth embodiment is characterized in that the NiMn switch bias layer or the FeMn switch bias layer 37, 38 is replaced by an insulating switch bias layer 61. In the spin valve structure 33, a magnetic layer 35' is laid on the NiO insulating switch bias layer 61 through a Cu antiferromagnetic bonding film 42 and a magnetic layer 41 and is the same as the sixth embodiment in structures of the other magnetic and non-magnetic layers.

On a substrate 50 with a pair of electrodes 39 formed on through an insulation film 49, a 10 nm-thick $Ni_{81}Fe_{19}$ magnetic film 34, a 2 nm-thick Cu spacer layer 26, a 4 nm-thick $Ni_{81}Fe_{19}$ magnetic film 35, a 20 nm-thick NiO insulating switch bias layer 61, a 2 nm-thick $Ni_{81}Fe_{19}$ magnetic film 41, a 1 nm-thick Cu antiferromagnetic bonding film 42, a 4 nm-thick $Ni_{81}Fe_{19}$ magnetic film 35', a 2 nm-thick Cu spacer layer 36' and a 10 nm-thick $Ni_{81}Fe_{19}$ magnetic film 34' are laid one on another, and a pair of electrodes 39' are formed thereon.

Figure 18:
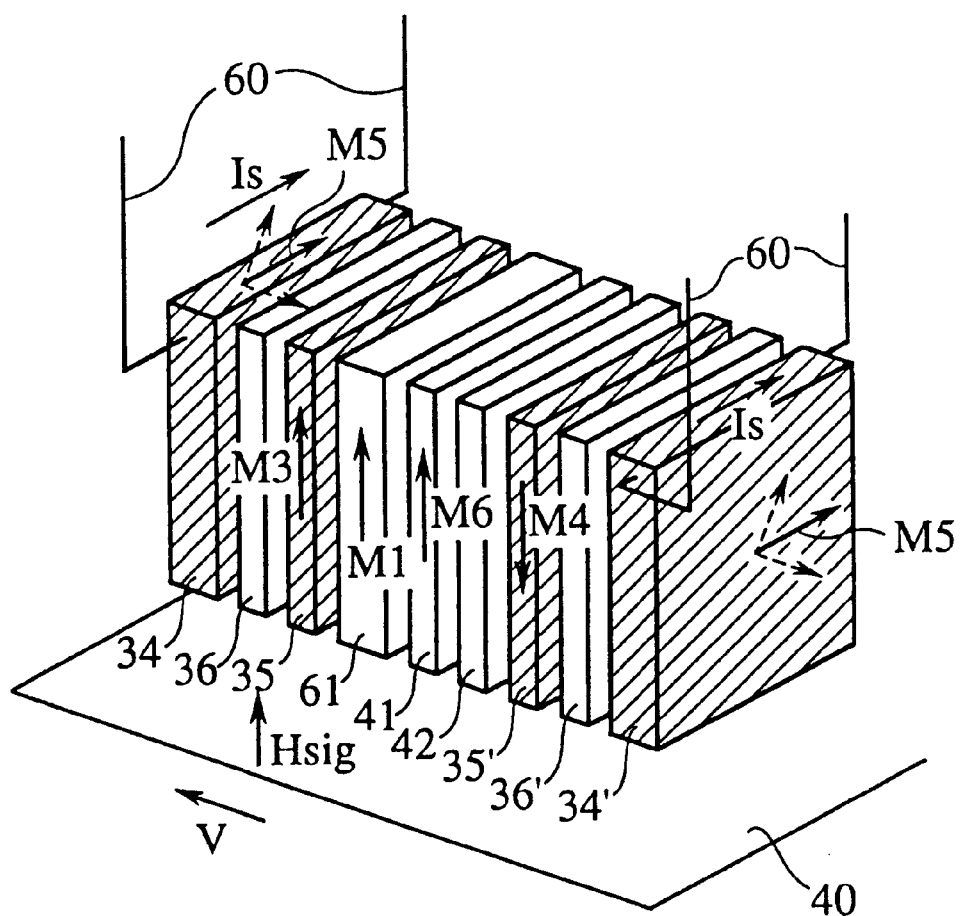
FIG. 18 is a development of the magnetic sensor according to the eighth embodiment of the present invention, which shows a structure thereof.
Figure 20:
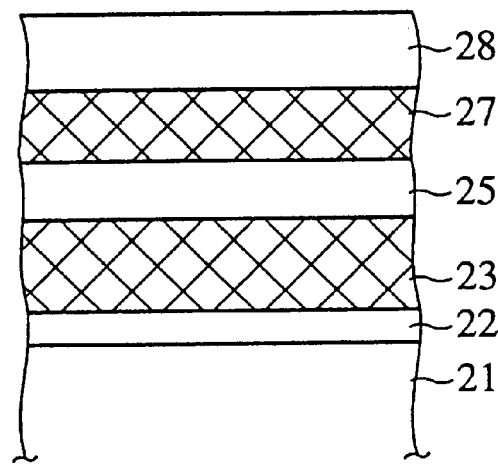
FIG. 20 is a schematic sectional view of a spin valve film of a conventional magnetic sensor.
Figure 21:
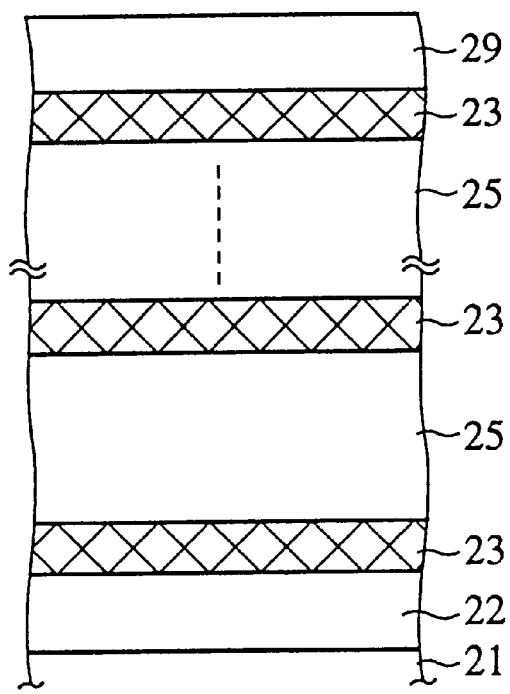
FIG. 21 is a schematic sectional view of a superlattice gigantic magnetoresistance film of a conventional magnetic sensor.

As shown in FIG. 18, sense current $I_c$ flows in a direction of width of a track, and a signal magnetic field $H_{sig}$ from a magnetic recording medium 40 enters the magnetic sensor in a direction parallel with a laid film interface and perpendicular to the sense current $I_c$. The NiO insulating switch bias layer 61 has magnetic anisotropy M1, so that magnetization directions of the magnetic films 35, 41 adjacent to the insulating switch bias layer 61 are pinned in the same directions M3, M6. At this time strong antiferromagnetic bonding takes place in the magnetic films 35', 41 through the Cu antiferromagnetic bonding film 42, and a magnetization direction of the magnetic film 35 is pinned in the magnetization direction M6 of the magnetic film 41, i.e., a direction M4 anti-parallel with the magnetization direction M1 of the NiO insulating switch bias layer 61. A magnetization direction of the magnetic films 34, 34' is an axis of easy magnetization M5 pinned in a direction of flow of the sense current $I_c$.

When a vertical signal magnetic field $H_{sig}$ from a magnetic recording medium 40 enters the magnetic sensor, the magnetization directions of the magnetic films 35, 41, which are pinned by the NiO insulating switch bias layer 61, do not change, but a magnetization direction of the magnetic films 34, 34' turns in place of the magnetic films 34, 34' in accordance with a direction of the signal magnetic field $H_{sig}$. At this time, because signal magnetic field $H_{sig}$ dependence of resistance values $r_2$, $r_3$ of the spin valve structures 32, 33 exhibits, as shown in FIG. 12, symmetric electric resistance changes with respect to the same signal magnetic field $H_{sig}$, output signals of the spin valve structures 32, 33 are independently detected, whereby the magnetic sensor operates as a differential magnetic sensor.

Changes of resistance values $r_2$, $r_3$ of the magnetic sensor according to the present embodiment are summarized in FIG. 19.

What is claimed is:

1. A magnetic sensor comprising:

a first magnetic layer having an axis of easy magnetization in a first direction;

a second magnetic layer having an axis of easy magnetization in a second direction different from the first direction;

a third magnetic layer positioned between the first magnetic layer and the second magnetic layer, and having a smaller coercive force than the first magnetic layer and the second magnetic layer;

a first insulating layer interposed between the first magnetic layer and third magnetic layer; and a second insulating layer interposed between the second magnetic layer and the third magnetic layer;

wherein an external magnetic field is detected by the use of tunnel resistance between the first magnetic layer and the third magnetic layer and tunnel resistance between the second magnetic layer and the third magnetic layer.

2. A magnetic sensor according to claim 1, wherein the first direction and the second direction are substantially opposite each other.

3. A magnetic sensor according to claim 2, wherein an axis of easy magnetization of the third magnetic layer is substantially normal to the first direction and the second direction.

4. A magnetic sensor according to claim 1, wherein an antiferromagnetic layer for pinning the axis of easy magnetization is included in at least one of the first magnetic layer and the second magnetic layer.

5. A magnetic sensor according to claim 1, wherein a coercive force is of the first magnetic layer and the second magnetic layer is larger than a saturation magnetic field in an axis of difficult magnetization of the third magnetic layer.

6. A magnetic sensor according to claim 1, wherein a static magnetic field due to the first magnetic layer and a static magnetic field due to the second magnetic layer compensates one another in the third magnetic layer.

* * * * *